(12) United States Patent
Yamaguchi

(10) Patent No.: US 6,765,458 B2
(45) Date of Patent: Jul. 20, 2004

(54) LC HIGH-PASS FILTER CIRCUIT DEVICE, LAMINATED LC HIGH-PASS FILTER DEVICE, MULTIPLEXER, AND RADIO COMMUNICATION APPARATUS

(75) Inventor: Naoto Yamaguchi, Shiga-ken (JP)

(73) Assignee: Murata Manufacturing Co., LTD, Kyoto (JP)

(*) Notice: Subject to any disclaimer, the term of this patent is extended or adjusted under 35 U.S.C. 154(b) by 0 days.

(21) Appl. No.: 10/270,689

(22) Filed: Oct. 16, 2002

(65) Prior Publication Data

US 2003/0076199 A1 Apr. 24, 2003

(30) Foreign Application Priority Data

Oct. 18, 2001 (JP) ........................................ 2001-320854
Sep. 20, 2002 (JP) ........................................ 2002-276045

(51) Int. Cl.[7] .............................. H03H 7/01; H03H 7/09
(52) U.S. Cl. ...................... 333/175; 333/176; 333/185
(58) Field of Search ................................ 333/175, 176, 333/185

(56) References Cited

U.S. PATENT DOCUMENTS 5,548,255 A * 8/1996 Spielman .................... 333/132
6,448,873 B1 * 9/2002 Mostov ....................... 333/185
6,504,451 B1 * 1/2003 Yamaguchi ................. 333/177

FOREIGN PATENT DOCUMENTS

| JP | 5-218778 | 8/1993 |
| JP | 2001-156569 | 6/2001 |

* cited by examiner

*Primary Examiner*—Barbara Summons
(74) *Attorney, Agent, or Firm*—Keating & Bennett, LLP

(57) ABSTRACT

An LC high-pass filter circuit device includes an inductor defined by via holes formed in adjacent insulating sheets which are connected in the direction of stacking of the sheets so as to define a single trap inductor. Inductor via holes formed in another insulating sheet define separate high-pass filter inductors. The trap inductor and the high-pass filter inductors have axes which extend substantially perpendicularly to the planes of the insulating sheets. Each of the high-pass circuit inductors defines, in combination with a high-pass filter capacitor, a high-pass filter circuit, while the trap inductor defines, in combination with a capacitor, a trap circuit. The high-pass filter circuits and the trap circuit in combination define a small-sized LC high-pass filter circuit device which exhibits high Q value and which excels in frequency characteristics, as well as a laminated LC high-pass filter device, a multiplexer and a radio communication apparatus incorporating the LC high-pass filter circuit device.

14 Claims, 18 Drawing Sheets

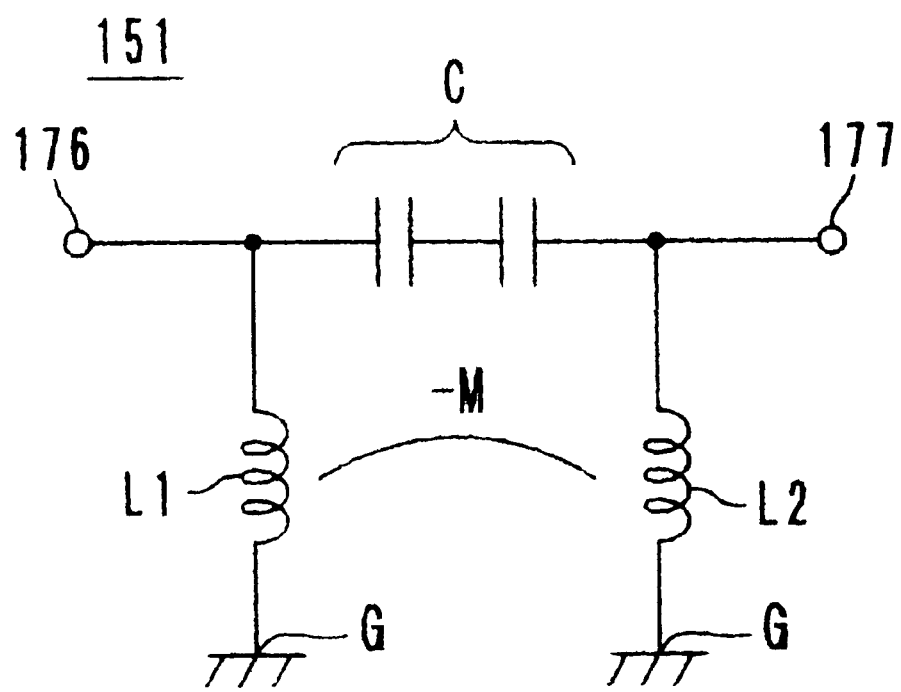

LC HIGH-PASS FILTER CIRCUIT DEVICE, LAMINATED LC HIGH-PASS FILTER DEVICE, MULTIPLEXER, AND RADIO COMMUNICATION APPARATUS

BACKGROUND OF THE INVENTION

1. Field of the Invention

The present invention relates to an LC high-pass filter circuit device, a laminated LC high-pass filter device, and a multiplexer which are suitable for use in, for example, a mobile communication device such as a cellular phone, and also relates to a radio communication apparatus.

2. Description of the Related Art

FIG. 16 shows the structure of a known laminated LC high-pass filter device of the type that is related to the present invention pertains. The known LC high-pass filter device, denoted generally by 151, has insulating sheets 152 to 158 which respectively support, as illustrated, input and output conductors 161 and 162, a resonance capacitive conductor 163, coiled conductors 164 to 169, and a grounding conductor 170.

The sheets 152 to 158 are stacked and baked to form an integral laminated structure 175 as shown in FIG. 17. An input terminal 176, an output terminal 177, and a grounding terminal G are formed on the laminated structure 175. The input conductor 161 is connected to the input terminal 176, and the output conductor 162 is connected to the output terminal 172. A grounding conductor 170 is connected to the grounding terminal G.

The coiled conductors 164 to 166 are connected in series through via holes 171b and 171c formed in the insulating sheets 155 and 156. Likewise, the coiled conductors 167 to 169 are connected in series through via holes 172b and 172c formed in the insulating sheets 155 and 156. The series connection of the coiled structures 164 to 165 defines an inductor L1, while the series connection of the coiled conductors 167 to 169 defines an inductor L2. The inductor L1 is electrically connected at one end thereof to the input conductor 161 through a via hole 171a formed in the insulating sheet 154. Similarly, the inductor L2 is electrically connected at one end thereof to the output conductor 162 through a via hole 172a formed in the insulating sheet 154. The other ends of the inductors L1 and L2 are electrically connected to the grounding conductor 170 through via holes 171d and 172d formed in the insulating sheet 157. The direction of winding of the inductor L1 and the direction of winding of the inductor L2 are opposite to each other. The capacitive conductor 163 opposes the input conductor 161 and the output conductor 162 across the insulating sheet 153 so as to define a resonance capacitor C.

FIG. 18 shows a circuit that is electrically equivalent to the laminated LC high-pass filter device 151 having the construction described above. Since the inductors L1 and L2 are wound in opposite directions, the inductors L1 and L2 are back-coupled to each other. Therefore, the -M produced by the inductive back-coupling of the inductors L1 and L2, the resonance capacitor C and the inductors L1 and L2 in combination define a trap circuit.

In the known LC high-pass filter 151 having the above-described construction, the major planes of the input conductor 161, output conductor 162 and the grounding conductor 170 substantially perpendicularly cross the lines of magnetic force generated by the inductors L1 and L2, due to the fact that the inductors L1 and L2 are respectively defined by the coiled conductors 164 to 166 and coiled conductors 167 to 169. Consequently, the lines of magnetic force generated by the inductors L1 and L2 produce large eddy current loss in, for example, the grounding conductor 170. This leads to production of the LC high-pass filter device 151 having a small Q value. In addition, it has been difficult to reduce the size, in particular the planar area, of the LC high-pass filter device 151, because the coiled conductors 164 to 166 and the coiled conductors 167 to 169 occupy considerably large areas.

In addition, with the equivalent circuit shown in FIG. 18, it is difficult to implement a high-pass filter device in which the attenuation pole of the trap circuit is positioned near the central frequency of the high-pass filter circuit.

SUMMARY OF THE INVENTION

In order to overcome the problems described above, preferred embodiments of the present invention provide an LC high-pass filter circuit device which has a high Q value and excellent frequency characteristics, and a laminated LC high-pass filter device, a multiplexer and a radio communication apparatus which include such a novel LC high-pass filter circuit device.

According to a preferred embodiment of the present invention, a LC high-pass filter circuit device includes a pair of terminals including an input terminal and an output terminal, at least two high-pass filter circuits including first capacitors connected in series between the input and output terminals and first inductors connected to the input and output terminals in parallel with each other and grounded, each of the high-pass filter circuits having one first capacitor and one first inductor, and a trap circuit including a series connection of a second capacitor and a second inductor, the series connection being grounded at one end and connected between two adjacent high-pass filter circuits so as to shunt from the input and output terminals.

Preferably, the first capacitor of each high-pass filter circuit is connected between the associated first inductor and the trap circuit.

With these unique structural features and arrangement, it is possible to locate the attenuation pole of the trap circuit at a position near the pass band of the high-pass filter circuit and, therefore, to obtain an LC high-pass filter circuit device having a sharp frequency characteristic.

The LC high-pass filter circuit device may further include third capacitors connected between the terminals and the node between the second capacitor and the second inductor of the trap circuit, the third capacitors defining band-adjusting capacitors.

This arrangement permits a signal path of a low impedance to be formed separately. Lower impedance allows greater signal traffic, making it possible to widen the passband of the LC high-pass filter circuit device.

According to another preferred embodiment of the present invention, a laminated LC high-pass filter device includes a laminated structure including a stack of a plurality of insulating layers, a plurality of capacitive conductors, and a plurality of coiled conductors, an input terminal, an output terminal, and a grounding terminal provided on surfaces of the laminated structure, a plurality of high-pass filter circuits disposed in the laminated structure, each of the high-pass filter circuits having a first capacitor defined by one of the capacitive conductors and a first inductor defined by one of the coiled conductors, and a trap disposed in the laminated structure and having a series connection of a second capacitor and a second inductor, the second capacitor being defined by one of the capacitive conductors and the second inductor being defined by one of the coiled conductors, wherein the first capacitors of the high-pass filter circuits are connected in series between the input terminal and the output terminal, and the first inductors of the high-pass filter circuits are connected to the input terminal and the output terminal in parallel to each other and are connected also to the grounding terminal, and wherein the trap is connected between two adjacent high-pass filter circuits so as to shunt from the input terminal and the output terminal, the series connection of the second capacitor and the second inductor being connected to the grounding terminal.

The arrangement may be such that at least a portion of the coiled conductor constituting the first inductor and at least a portion of the coiled conductor constituting the second inductor are defined by inductor via holes formed in the insulating layer or, alternatively, by a helical coiled conductor or a spiral coiled conductor. Inductor via holes have axes extending in the direction of the stack of layers that defines the laminated structure. By forming at least a portion of the inductors by such inductor via holes, it is possible to obtain an LC high-pass filter or a trap having high Q value. In addition, the area of the LC high-pass filter can be reduced because the inductor via holes occupy only small areas.

The arrangement also may be such that the coiled conductor constituting the first inductor and the coiled conductor constituting the second inductor are located at different positions in the stacking direction of the stacked layers forming the laminated structure. Thus, the first inductor and the second inductor provide a multi-stage arrangement within the laminated structure. This arrangement minimizes the electromagnetic coupling between the LC high-pass filter having the first inductor and the trap having the second inductor, thus preventing degradation of the high-frequency characteristic, while reducing the planar area of the laminated LC high-pass filter device.

It is also preferred that the trap is disposed at a level or vertical position that is higher than that of the high-pass filter circuits in the stacking direction of the insulating layers. This arrangement prevents electric fields and magnetic fields from leaking to the exterior of the laminated LC high-pass filter device through the first inductors of the high-pass filter circuits.

The arrangement may also be such that the first inductor of each of the high-pass filter circuits has a major portion constituted by an inductor via hole having an axis extending in the stacking direction of the insulating layers and a minor portion constituted by a helical coiled conductor or a spiral coiled conductor provided on the surface of the insulating layer, the major and minor portions being electrically connected to each other. This arrangement advantageously reduces the height of the first inductors of the high-pass filter circuits.

According to other preferred embodiments of the present invention, a multiplexer and a radio communication apparatus each includes a laminated LC high-pass filter device according to preferred embodiments described above. The multiplexer and the radio communication apparatus thus obtained have greatly reduced sizes.

Other features, elements, characteristics and advantages of the present invention will become more apparent from the following detailed description of preferred embodiments with reference to the attached drawings.

BRIEF DESCRIPTION OF THE DRAWINGS

FIG. 18 is an equivalent electric circuit diagram of the laminated LC high-pass filter device shown in FIG. 17.

DETAILED DESCRIPTION OF PREFERRED EMBODIMENTS

Preferred embodiments of the present invention will now be described with reference to the accompanying drawings.

Reference is made to FIGS. 1 to 8 which in combination show a laminated LC high-pass filter device according to a first preferred embodiment of the present invention.

Figure 1:
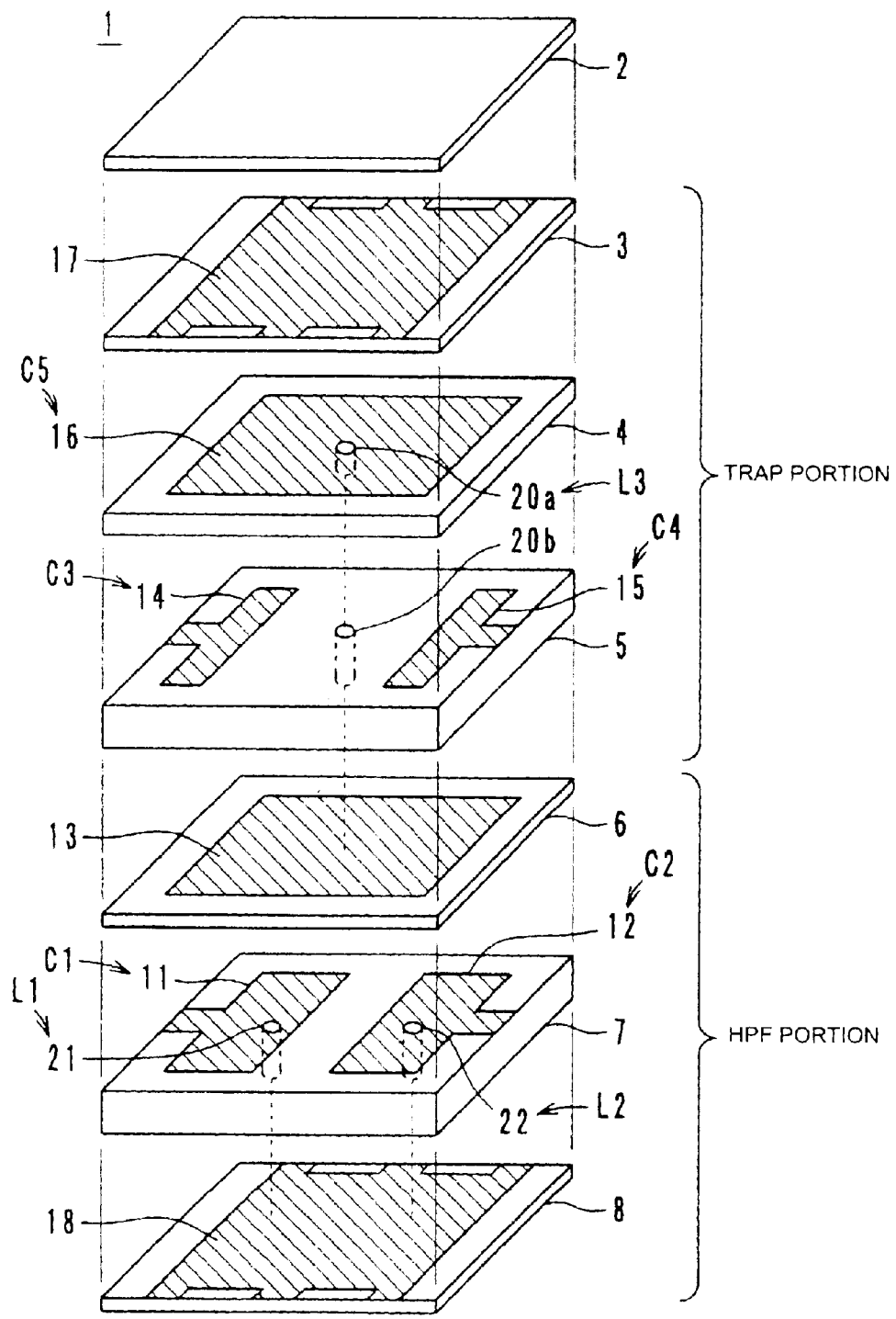
FIG. 1 is an exploded perspective view of a first preferred embodiment of the laminated LC high-pass filter device in accordance with the present invention.

Referring first to FIG. 1, the laminated LC high-pass filter device 1 has an insulating sheet 2 and other insulating sheets which carry or have, as illustrated, input and output conductors 11 and 12, a high-pass filter capacitive conductor 13, band-adjust capacitive conductors 14 and 15, a trap capacitive conductor 16, grounding conductors 17 and 18, and inductor via holes 20a, 20b, 21 and 22. Each of the insulating sheets 2 to 8 are preferably formed from a sheet of a material obtained by kneading dielectric powders and magnetic powders together with a binding agent.

The insulating sheet 4 having the via hole 20a, the insulating sheet 5 having the via hole 20b and the insulating sheet 7 having the via holes 21 and 22 preferably have thicknesses that are greater than that of other insulating sheet. Such greater thicknesses may be achieved by stacking a plurality of sheets each being provided with a via hole and having the same thickness as other insulating sheets, such that the via holes are aligned and connected. Alternatively, thicker insulating sheets having the required greater thicknesses may be separately prepared and used.

Each of the conductors 11 to 18 is preferably formed by a suitable method such as sputtering, deposition, printing, or photolithography, and is formed of Ag, Pd, Cu, Ni, Au, Ag—Pd, or other suitable materials. The inductor via holes 20a, 20b, 21 and 22 are formed by piercing the corresponding insulating sheets 4, 5 and 7 preferably using a laser beam or a mold and filling the holes with the conductive material such as Ag, Pd, Cu, Ni, Au, Ag—Pd, or other suitable material. Alternatively, such a conductive material is deposited on the inner surfaces of the holes, without completely filling the holes.

The inductor via holes 20a, 20b are connected in the direction of the stack of the insulating sheets 2 to 8 so as to define a columnar inductor L3. The inductor via holes 21 and 22 define separate columnar inductors L1 and L2. These columnar inductors L1 to L3 have axes which are substantially perpendicular to the planes of the sheets 2 to 8. The inductors L1 and L2 define parts of high-pass filter circuits. The inductor L1 is connected at one end to the input conductor 11 and at the other end to the grounding conductor 18. The inductor L2 is connected at one end to the output inductor 12 and at the other end to the grounding conductor 18. The inductor L3, which defines a part of the trap, is connected at one end to the capacitive conductor 16 which also defines part of the trap and at the other end to the capacitive conductor 13 which defines parts of the high-pass filter circuits.

The input conductor 11 and the output conductor 12, which are located on a left side region and right side region of the insulating sheet 7 as viewed in FIG. 1, are exposed on the left and right end surfaces of the sheet 7. The input conductor 11 and the output conductor 12 oppose the capacitive conductor 13 across the insulating sheet 6, thus defining capacitors C1 and C2 of the high-pass filter circuits.

The band-adjust capacitive conductors 14 and 15 are disposed on left and right regions of the insulating sheet 5 and are exposed on the left and right end surfaces of the sheet 5. The band-adjust capacitive conductors 14 and 15 oppose the trap-forming capacitive conductor 16 across the insulating sheet 4, so as to define band-adjust capacitors C3 and C4. The trap-forming conductor 16 also opposes the grounding conductor 17 so as to define a trap capacitor C5.

Figure 2:
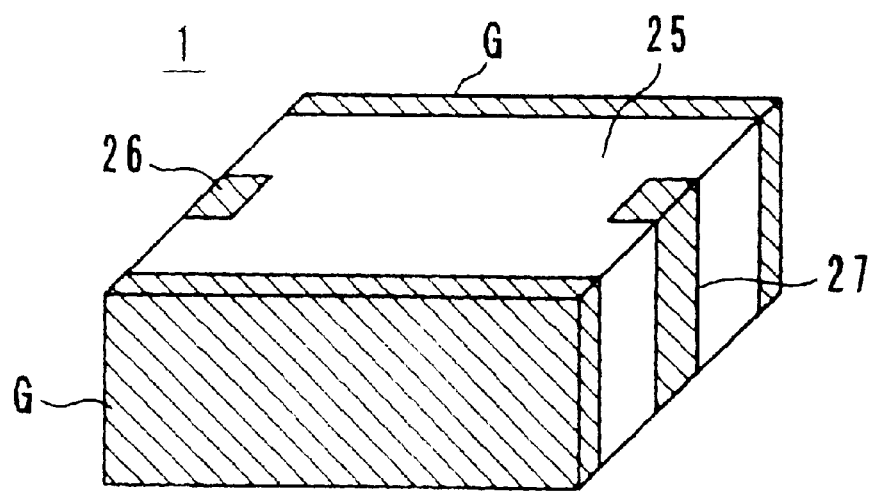
FIG. 2 is a perspective view of the laminated LC high-pass filter device shown in FIG. 1.
Figure 3:
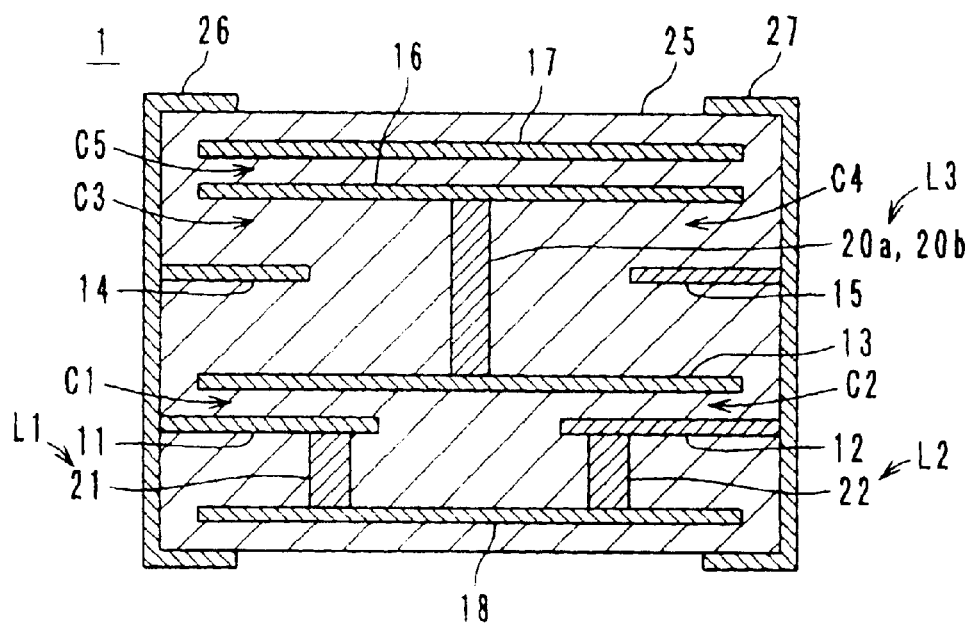
FIG. 3 is a schematic sectional view of the laminated LC high-pass filter device shown in FIG. 2.

The sheets 2 to 8 are stacked and baked to form a laminated structure 25 as shown in FIGS. 2 and 3. An input terminal 26 and an output terminal 27 are disposed on the left and right end surfaces of the laminated structure 25. Grounding terminals G are disposed on the front and rear end surfaces of the laminated structure 25. These terminals 26, 27 and G are preferably made from a conductive material such as Ag—Pd, Ag, Pd, Cu or a Cu alloy or other suitable material by a method such as sputtering, deposition, application or printing or other suitable method.

The input conductor 11 and the band-adjust capacitive conductor 14 are electrically connected to the input terminal 26. The output conductor 12 and the band-adjust capacitive conductor 15 are electrically connected to the output terminal 27. The grounding conductors 17 and 18 are connected to the grounding terminal G.

Figure 4:
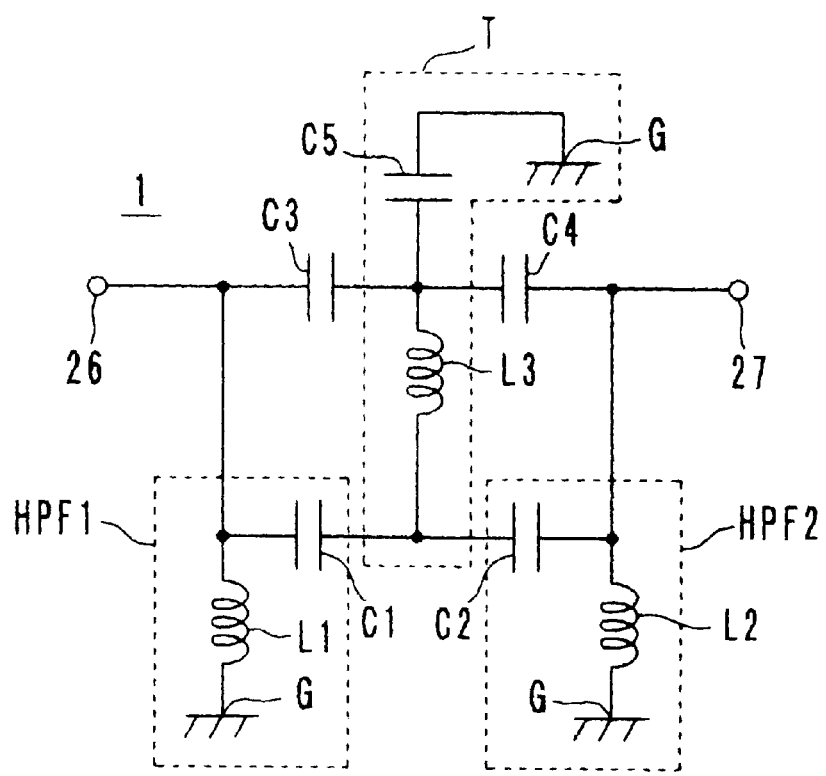
FIG. 4 is an equivalent electric circuit diagram of the laminated LC high-pass filter device shown in FIG. 2.
Figure 5:
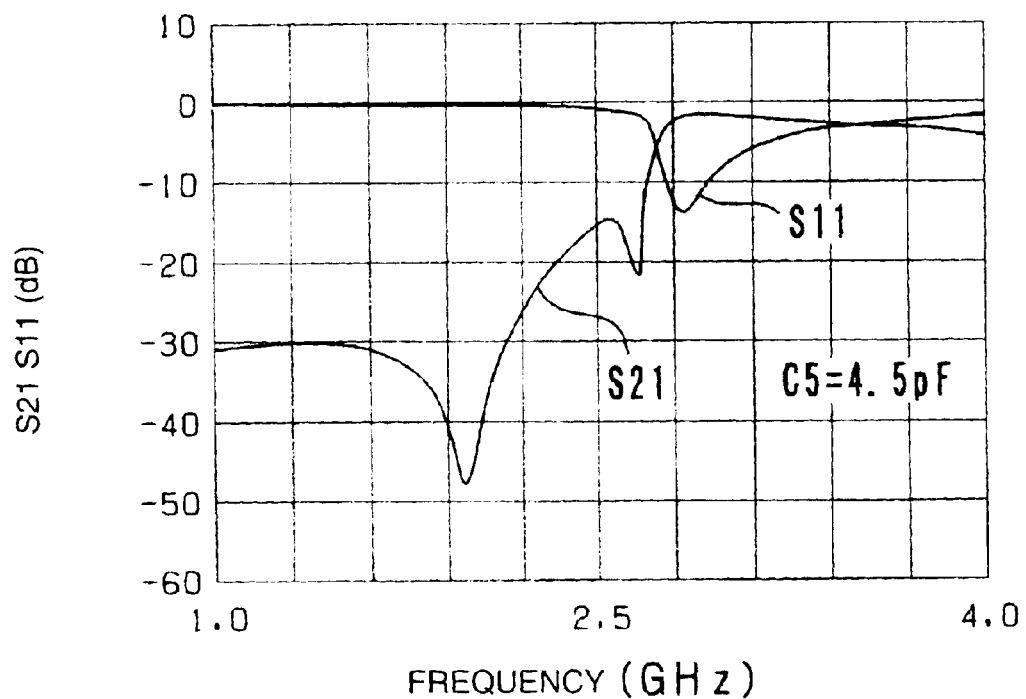
FIG. 5 is a graph showing transmission characteristics and reflection characteristics of the laminated LC high-pass filter device shown in FIG. 2.
Figure 6:
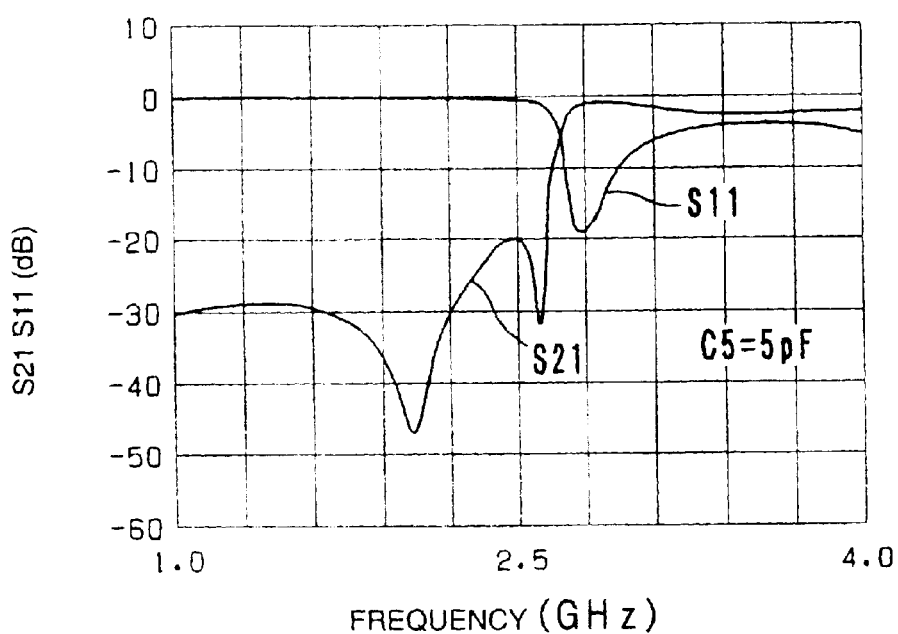
FIG. 6 is a graph showing transmission characteristics and reflection characteristics of the laminated LC high-pass filter device shown in FIG. 2, obtained with a different value of capacitance of a capacitor in a trap circuit.
Figure 7:
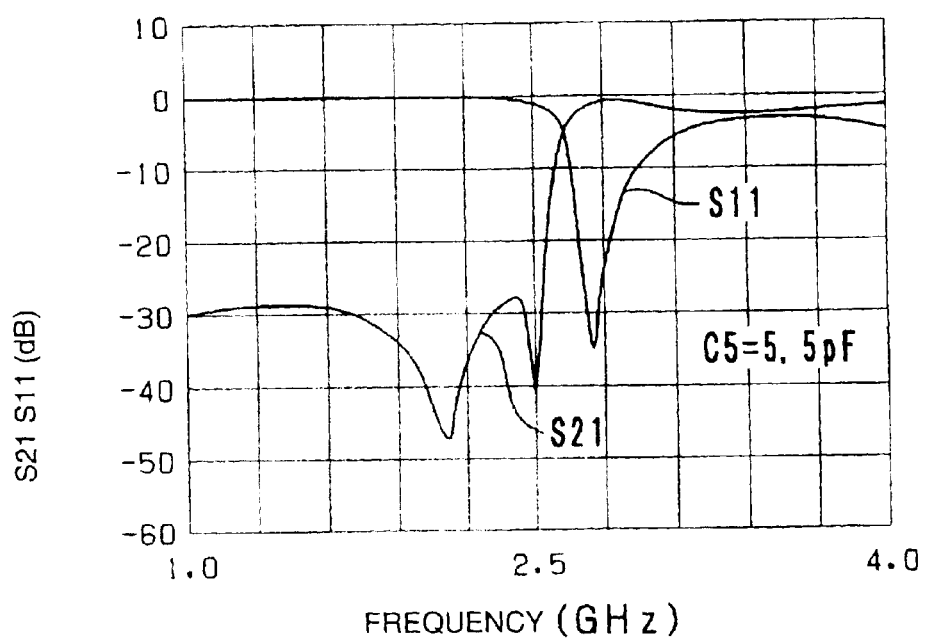
FIG. 7 is a graph showing transmission characteristics and reflection characteristics of the laminated LC high-pass filter device shown in FIG. 2, obtained with a different value of capacitance of a capacitor in a trap circuit.
Figure 8:
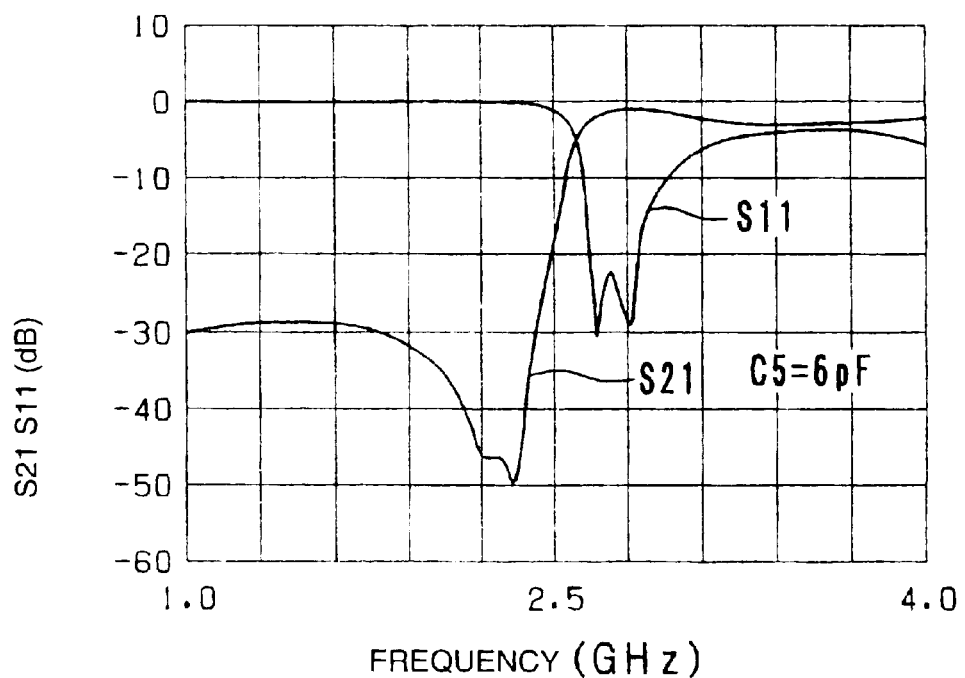
FIG. 8 is a graph showing transmission characteristics and reflection characteristics of the laminated LC high-pass filter device shown in FIG. 2, obtained with a different value of capacitance of a capacitor in a trap circuit.

FIG. 4 is a circuit diagram showing an electrical circuit equivalent to the laminated LC high-pass filter device 1. The high-pass filter capacitor C1 and the high-pass filter inductor L1 in combination define an input high-pass filter circuit HPF1. Likewise, the high-pass filter capacitor C2 and the high-pass filter inductor L2 in combination define an output high-pass filter circuit HPF2. The trap capacitor C5 and the trap inductor L3 define an LC series resonance circuit which functions as a trap circuit T.

The capacitors C1 and C2 of the high-pass filter circuits HPF1 and HPF2 are connected in series between the input and output terminals 26 and 27. The inductors L1 and L2 of the high-pass filter circuits HPF1 and HPF2 are connected to the input and output terminals 26 and 27 in parallel with each other. Each of the inductors L1 and L2 is connected at one end to the ground terminals G. The trap circuit T has one end which is connected to a node between the two high-pass filter circuits HPF1 and HPF2 so as to shunt from the input and output terminals 26 and 27, and has the other end which is connected to the grounding terminal G.

The band-adjust capacitor C3 is connected between the input terminal 26 and a node between the capacitor C5 of the trap circuit T and the inductor L3. Likewise, the band-adjust capacitor C4 is connected between the output terminal 27 and a node between the capacitor C5 of the trap circuit T and the inductor L3. The band-adjust capacitors C3 and C4 contribute to widening of the LC high-pass filter device 1.

Thus, the laminated LC high-pass filter 1 has the trap circuit T as shown in FIG. 4. By virtue of the provision of this trap circuit T, it is possible to locate the attenuation pole of the trap at a position near the pass band of the high-pass filter circuits HPF1 and HPF2. It is therefore possible to obtain an LC high-pass filter having a sharp characteristic.

In general, the bandwidth of a filter is widened when the signal traffic, i.e., the quantity of signals, between the input and output terminals is large. The band-adjust capacitors C3 and C4 provide capacitances between the input terminal 26 and the output terminal 27, thus functioning as by-pass capacitors, whereby a low-impedance signal path is separately formed. Such a low impedance allows greater signal traffic, so that the bandwidth of the LC high-pass filter device 1 can be widened.

FIGS. 5 to 8 are graphs showing the transmission characteristic S21 and the input reflection characteristic S11 of the LC high-pass filter device 1, as obtained with different values of capacitance of the trap capacitor C5, on conditions that the inductance of the inductors L1 and L2 is approximately 0.67 nH, the capacitance of the high-pass filter capacitors C1, C2 and the capacitance of band-adjust capacitors C3 and C4 are approximately 3 pF, the inductance of the inductor L3 is approximately 0.8 nH, and the coupling coefficient between the inductors L1 and L2 is approximately 0.2.

From FIGS. 5 to 8 demonstrate that the attenuation pole can further approach the pass band of the LC high-pass filter device 1 when the capacitance of the trap capacitor C5 is reduced. It is also understood that an increase in the capacitance of the trap capacitor C5 provides a greater amount f attenuation although the position of the attenuation pole is moved somewhat away from the pass band of the LC high-pass filter device 1. It is therefore possible to obtain a desired filtering characteristic of the LC high-pass filter device 1 by adjusting the capacitance of the trap capacitor C5 according to the use of the LC high-pass filter device 1.

A capacitance of the trap capacitor C5 that is too small causes the attenuation pole to be located within the pass band of the LC high-pass filter device 1. In the preferred embodiment shown in FIGS. 1 to 8, therefore, it is preferred that the capacitance of the trap capacitor C5 is approximately 4 pF or greater.

In the laminated LC high-pass filter device 1 having the above-described construction, the inductors L1 and L2 of the high-pass filter circuits HPF1 and HPF2 are defined mainly by the inductor via holes 21 and 22 which have axes extending in the direction of stack of the insulating sheets 2 to 8. Similarly, the inductor L3 of the trap circuit T is defined by the series connection of the inductor via holes 20a and 20b having a common axis extending in the direction of stack of the insulating sheets 2 to 8. Consequently, the lines of magnetic forces produced by the inductors L1 to L3 run substantially parallel with the major surfaces of the capacitive conductors 13 and 16 and the grounding conductor 18. This means that eddy current losses, which are caused in the conductors 13, 16 and 18 by the lines of magnetic forces of the inductors L1 to L3, are minimized to prevent deterioration of the Q value. Consequently, the high-pass filter circuits HPF1 and HPH2, as well as the trap circuit T, have very high Q values.

The inductor via holes 20a, 20b, 21 and 22 occupy only small planar areas so that the laminated LC high-pass filter device 1 can have a reduced area in a plane that is substantially perpendicular to the stacking direction of the stack of the layers 2 to 8. In the illustrated preferred embodiment, a further reduction in the area is achieved by virtue of the fact that the inductors L1, L2 of the high-pass filter circuits HPF1, HPF2 and the inductor L3 of the trap circuit T are located at different positions in the stacking direction of the stack of the insulating layers 2 to 8, i.e., on different layers of the laminated structure 25. Consequently, the laminated LC high-pass filter device 1 has a greatly reduced size as compared to known filter devices. For example, the laminated LC high-pass filter device 1 of this preferred embodiment can be as small as about 2.0 mm in length, about 1.25 mm in width and about 1.05 mm in height, in terms of representative values.

In the first preferred embodiment as described above, the inductor L3 of the trap circuit T and the inductors L1, L2 of the high-pass filter circuits HPF1, HPF2 are spaced from each other in the stacking direction of the layers constituting the laminated structure 25. This minimizes magnetic coupling between the inductor L3 and the inductors L1, L2 and, therefore, eliminates any tendency for the signals flowing in the high-pass filter circuits HPF1 and HPF2 to enter the inductor L3 of the trap circuit T. This also allows the high-pass filter circuits HPF1, HPF2 and the trap circuit T to be designed separately, thus enhancing versatility of the design. At the same time, this arrangement minimizes the tendency for the signals in the high-pass filter circuits HPF1, HPF2 to flow into the ground through the trap circuit T, thus increasing the input impedance. It is therefore possible to prevent deterioration of the RF characteristics, in particular the input reflection characteristic S11. A magnetic coupling between the inductors L1 and L2 of the high-pass filter circuits HPF1 and HPF2, if any, does not cause any substantial detrimental effect on the RF characteristics.

It is also to be understood that the illustrated preferred embodiment allows an efficient use of the space or internal volume of the laminated LC high-pass filter device 1, by virtue of the fact that the inductances L1, L2 of the high-pass filter circuits HPF1, HPF2 and the inductor L3 of the trap circuit T are provided on different layers of the stack, thus contributing to a further reduction in the area of the laminated LC high-pass filter device 1. It is also possible to keep a large distance between the inductor via holes 21 and 22 which are formed in one insulating sheet, i.e., the conductor 17. This is because the number of the inductor via holes to be formed in the same layer is reduced. Consequently, the laminated LC high-pass filter device 1 of the illustrated preferred embodiment has high mechanical strength and a reduced area.

As described before, the trap circuit T is positioned at a level higher than that of the high-pass filter circuits HPF1, HPF2 as viewed in the stacking direction of the insulating layers 2 to 8. This arrangement makes it possible to reduce the aperture ratio of the grounding conductors 17, 18 as compared to the case where the trap circuit T is disposed at a level lower than the high-pass filter circuit, thus contributing to suppression of leakage of the electric field and magnetic field through the apertures.

Figure 9:
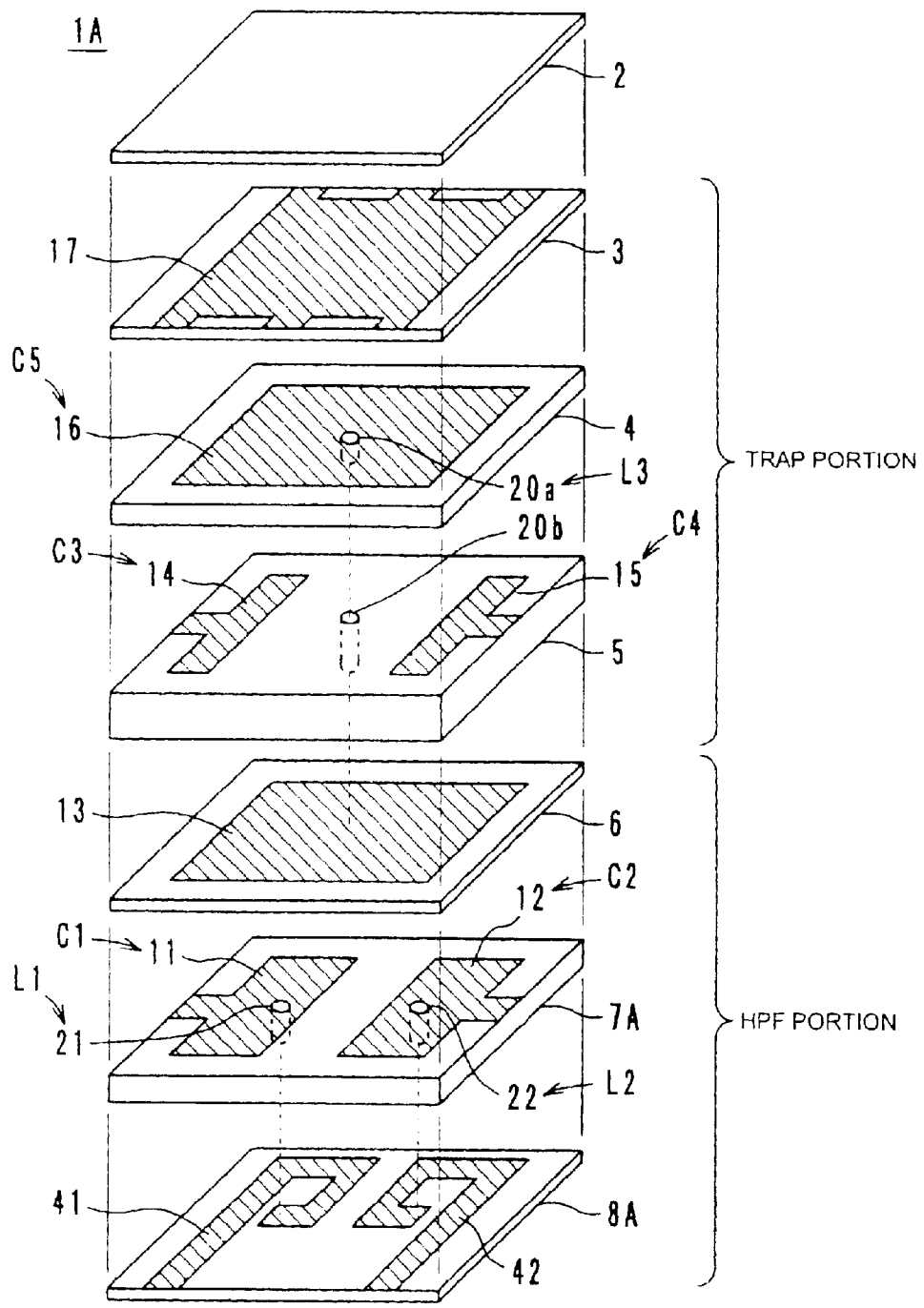
FIG. 9 is an exploded perspective view of a second preferred embodiment of the laminated LC high-pass filter device in accordance with the present invention.

A laminated LC high-pass filter device according to a second preferred embodiment of the present invention will now be described with specific reference to FIG. 9. The laminated LC high-pass filter device 1A of this preferred embodiment has a construction which is similar to that of the laminated LC high-pass filter device 1 of the first preferred embodiment, but has insulating sheets 7A and 8A which are different from the sheets 7 and 8 used in the first preferred embodiment.

Substantially helical coiled conductors 41 and 42 are disposed on the surface of the insulating sheet 8A. More specifically, the coiled conductor 41 is disposed on a left half portion of the sheet 8A and has a lead which is exposed on the front end surface of the sheet 8A at a position near the left end of the sheet 8A, and is connected to the grounding terminal G. Likewise, the coiled conductor 42 is located on a right half portion of the sheet 8A and has a lead which is exposed on the front end surface of the sheet 8A at a position near the right end of the sheet 8A, and is connected to the grounding terminal G.

The insulating sheet 7A has an inductor via hole 21 formed therein. The inductor via hole 21 is serially connected to the coiled conductor 41 so as to cooperate with the coiled conductor 41 to provide an inductor L1 having a desired inductance. The insulating sheet 7A also has an inductor via hole 22 formed therein. The inductor via hole 22 is serially connected to the coiled conductor 42 so as to cooperate with the coiled conductor 42 to provide an inductor L2 having a desired inductance.

The LC high-pass filter device 1A having the above-described construction enables the length of the inductor via holes 21 and 22 to be reduced, because portions of the high-pass filter circuits HPF1 and HPF2 are defined by the coiled conductors 41 and 42 that are provided on the surface of the insulating sheet 8A. This permits a reduction in the thickness of the insulating sheet 7A and, hence, a reduced height of the laminated LC high-pass filter device 1A as compared to the laminated LC high-pass filter device 1 of the first preferred embodiment.

A description will now be given of a laminated LC high-pass filter device according to a third preferred embodiment of the present invention, with reference to FIGS. 10 to 13.

The laminated LC high-pass filter device of the third preferred embodiment is different from the laminated LC high-pass filter device 1 of the first preferred embodiment in that the pair of band-adjust capacitors C3 and C4 are omitted. Although the use of capacitors C3 and C4 is preferred to achieve a large bandwidth as in the first and second preferred embodiments, these capacitors may be omitted if no specific requirement exists for widening the bandwidth. The attenuation pole can be located at a position near the pass band of the high-pass filter circuits HPF1 and HPF2, and an LC high-pass filter device having sharp characteristics is obtainable, even when the band-adjust capacitors C3 and C4 are omitted. Omission of the band-adjust capacitors C3 and C4 also offers an advantage in that the size of the laminated LC high-pass filter device can be reduced, because the capacitive conductors for defining these capacitors C3 and C4 can be eliminated.

Figure 10:
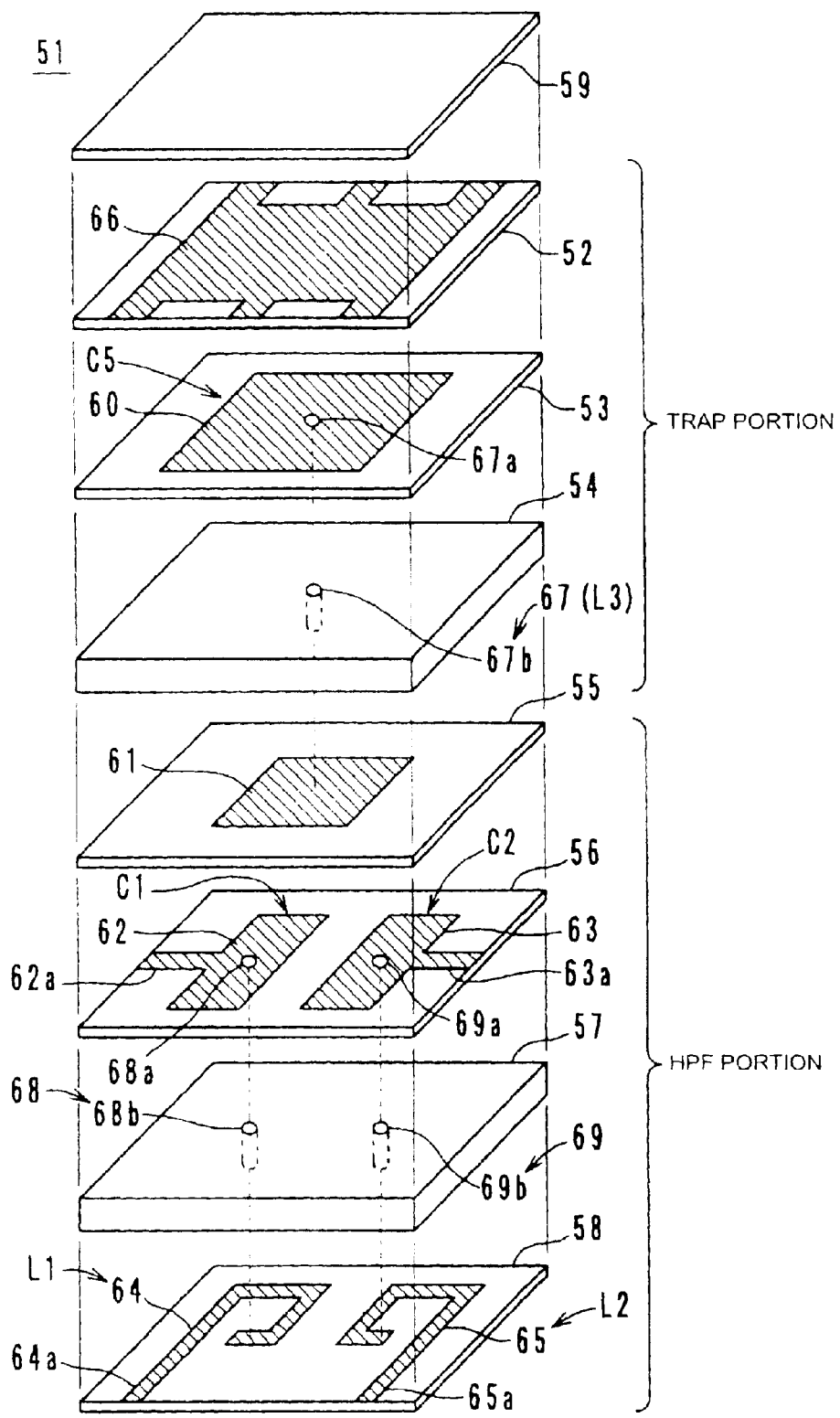
FIG. 10 is an exploded perspective view of a third preferred embodiment of the laminated LC high-pass filter device in accordance with the present invention.

Referring to FIG. 10, a laminated LC high-pass filter device according to the third preferred embodiment of the present invention, denoted generally by 51, includes the following insulating sheets in addition to an insulating sheet 59: an insulating sheet 52 having a grounding conductor 66 disposed on the upper surface thereof, an insulating sheet 53 having a trap capacitive conductor 60 disposed on the upper surface thereof, an insulating sheet 54 having an inductor via hole 67b formed therein, an insulating sheet 55 having a high-pass filter capacitive conductor 61 disposed on the upper surface thereof, an insulating sheet 56 having input and output conductors 62 and 63 disposed on the upper surface thereof and inductor via holes 68a and 69a formed therein, an insulating sheet 57 having inductor via holes 68b, 69b formed therein, and an insulating sheet 58 having helical coiled conductors 64 and 65 disposed on the upper surface thereof.

The input conductor 62 and the output conductor 63 are located on the left half portion and the right half portion of the insulating sheet 56. The input conductor 62 has a lead 62a which is exposed on the left end surface of the sheet 56, while the output conductor 63 has a lead 63a which is exposed on the right end surface of the sheet 56. The input conductor 62 and the output conductor 63 oppose the high-pass filter capacitive conductor 61 across the insulating sheet 56, thus defining high-pass filter capacitors C1 and C2.

The inductor via holes 68a and 68b are aligned with and serially connected to each other in the stacking direction of the insulating sheets 52 to 59 so as to define a columnar inductor 68. Similarly, the inductor via holes 69a and 69b are aligned with and serially connected to each other in the stacking direction of the insulating sheets 52 to 59 so as to define a columnar inductor 69. The columnar inductors 68 and 69 have axes that are substantially perpendicular to the surfaces of the insulating sheets 52 to 59. Electrical currents flowing in the columnar inductors 68 and 69 produce magnetic fields around these columnar conductors 68 and 69. These magnetic fields circulate in a plane that is substantially perpendicular to the axes of the columnar conductors 68 and 69. The columnar inductor 68 is connected at one end, i.e., at the via hole 68a, to the input conductor 62, and the columnar inductor 69 is connected at one end, i.e., at the via hole 69a, to the output conductor 63. The columnar inductor 68 is connected at the other end, i.e., at the via hole 68b, to the helical coiled conductor 64, and the columnar inductor 69 is connected at the other end, i.e., at the via hole 69b, to the helical coiled conductor 65.

The columnar inductor 68 and the helical coiled conductor 64 in combination define a high-pass filter inductor L1. Likewise, the columnar inductor 69 and the helical coiled conductor 65 in combination define a high-pass filter inductor L2. With this arrangement, the helical coiled conductors 64 and 65 make up for any insufficiency of the electrical length, i.e., the inductance value, which may occur if the inductors L1 and L2 are defined by the columnar inductors 68, 69 alone. It is therefore possible to effectively use the internal volume of the laminated LC high-pass filter device 51 and, therefore, to reduce the size of the same.

The trap conductor 60 opposes the grounding conductor 66 across the insulating sheet 52, whereby a trap capacitor C5 is provided. The inductor via holes 67a and 67b are aligned with and connected in series to each other in the direction of the stack of the insulating sheets 52 to 59, thereby defining a columnar inductor 67. The columnar inductor 67 is connected at one end, i.e., the via hole 67a, to the trap capacitive conductor 60 and at the other end, i.e., at the via hole 67b, to the high-pass filter capacitive conductor 61. The columnar inductor 67 by itself defines a trap inductor L3.

The inductance values of the columnar inductors 67 to 69 can be adjusted by varying the thicknesses of the insulating sheets 54 and 57. For instance, greater inductance values are obtainable by increasing the thicknesses of these insulating sheets 54 and 57. Such an increase in the sheet thickness may be achieved by using thicker insulating sheets as the insulating sheets 54 and 57, or, alternatively, by stacking a plurality of thin sheets each being as thin as the sheet 56, to form each of the insulating sheets 54 and 57.

Figure 11:
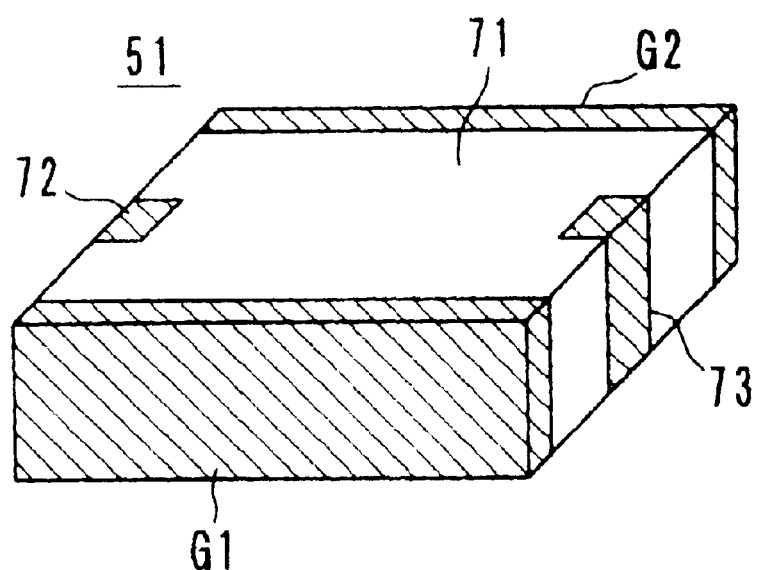
FIG. 11 is a perspective view of the laminated LC high-pass filter device shown in FIG. 10.

The insulating sheets 52 to 58 are stacked and the stack is overlain by the insulating sheet 59 which is a protective sheet. These sheets are then baked to provide a laminated structure 71 as shown in FIG. 11. An input terminal 72 and an output terminal 73 are formed on the left and right end surfaces of the laminated structure 71. Grounding terminals G1 and G2 are formed on the front and rear end surfaces of the laminated structure 71. The input conductor 62 has a lead 62a which is connected to the input terminal 72. The output conductor 63 has a lead 63a which is connected to the output terminal 73. Leads 64a and 65a of the helical coiled conductors 64 and 65 are connected to the grounding terminal G1. The grounding conductor 66 also is connected at one end to the grounding terminal G1. The other end of the grounding conductor 66 is connected to the grounding terminal G2.

Figure 12:
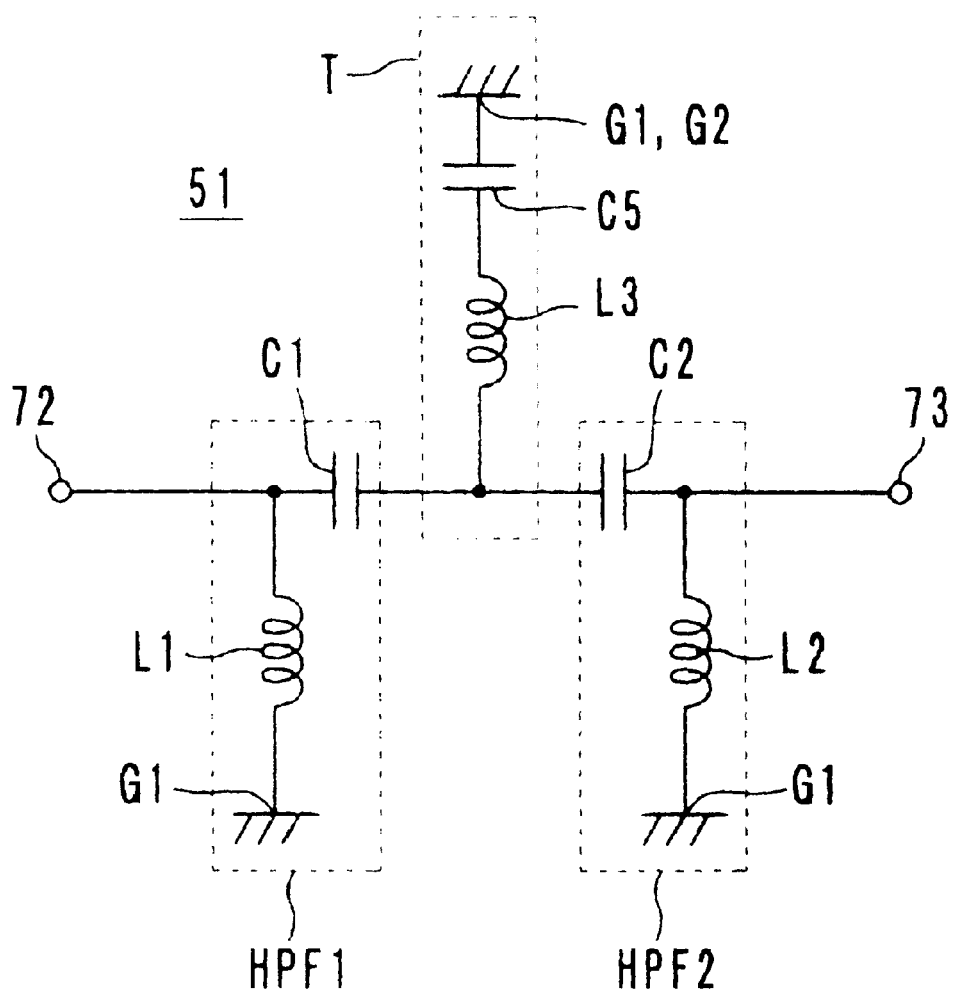
FIG. 12 is an equivalent electric circuit diagram of the laminated LC high-pass filter device shown in FIG. 11.

FIG. 12 is an electrical circuit diagram showing an electrical circuit equivalent to the laminated LC high-pass filter device 51 having the described construction. The high-pass filter capacitor C1 and the high-pass filter inductor L1 in combination define an input high-pass filter circuit HPF1. Likewise, the high-pass filter capacitor C2 and the high-pass filter inductor L2 in combination define an output high-pass filter circuit HPF2. The trap capacitor C5 and the trap inductor L3 in combination define a series resonance circuit which functions as a trap circuit T.

The capacitors C1 and C2 of the high-pass filter circuits HPF1 and HPF2 are connected in series between the input terminal 72 and the output terminal 73. The inductors L1 and L2 of the high-pass filter circuits HPF1 and HPF2 are connected to the input and output terminals 72 and 73 in parallel, and are connected also to the grounding terminal G1. The trap circuit T is connected to a node between the high-pass filter circuits HPF1 and HPF2 in parallel to the input and output terminals 72 and 73 and is connected at one end to the grounding terminals G1 and G2.

It is thus possible to obtain a laminated LC high-pass filter device 51 which is suitable for narrow-band design and which has greatly reduced area and height.

In the third preferred embodiment as described, the inductor L3 of the trap circuit T and the inductors L1, L2 of the high-pass filter circuits HPF1, HPF2 are spaced from each other in the stacking direction of the stacked layers forming the laminated structure 71. This arrangement conveniently minimizes magnetic coupling between the inductors L1, L2 and the inductor L3 and, therefore, significantly reduces the tendency for the signals in the high-pass filter circuits HPF1, HPF2 to flow into the inductor L3 of the trap circuit T. This permits the high-pass filter circuits HPF1, HPF2 and the trap circuit T to be designed independently of each other, thus enhancing versatility of the design of the laminated LC high-pass filter device. At the same time, this arrangement minimizes the tendency for the signals in the high-pass filter circuits HPF1, HPF2 to flow into the ground through the trap circuit T, thus increasing the input impedance. It is therefore possible to prevent deterioration of the RF characteristics, in particular the input reflection characteristic S11. A magnetic coupling between the inductors L1 and L2 of the high-pass filter circuits HPF1 and HPF2, if any, does not cause any substantial detrimental effect on the RF characteristics.

It is also to be understood that the illustrated preferred embodiment allows an efficient use of the space or internal volume of the laminated LC high-pass filter device 51, by virtue of the fact that the inductances L1, L2 of the high-pass filter circuits HPF1, HPF2 and the inductor L3 of the trap circuit T are provided on different layers of the stack, thus contributing to a further reduction in the area of the laminated LC high-pass filter device 51. It is also possible to keep a large distance between the inductor via holes 68a and 69a which are formed in one insulating sheet, i.e., the conductor 56, as well as between the inductor via holes 68b and 69b which are formed in one insulating sheet, i.e., the conductor 57. This is because the number of the inductor via holes to be formed in the same layer is reduced. Consequently, the laminated LC high-pass filter device 51 of the illustrated preferred embodiment has very high mechanical strength and a reduced area.

In addition, since the inductor L3 of the trap circuit T is defined by the inductor via holes 67a and 67b which are aligned with and connected in series to each other in the stacking direction of the insulating sheets 52 to 59, the lines of magnetic force produced by the inductor L3 run substantially parallel with the major plane of the conductors such as the capacitive conductors 60 and 61. This reduces eddy current losses in these conductors caused by the lines of magnetic force produced by the inductor L3, thus preventing deterioration of the Q value. In addition, the Q value is improved because the inductor L3 is allowed to have an increased cross-sectional area. Consequently, the trap circuit T can have a high Q value and, hence, exhibit sharp characteristic and large attenuation.

Portions of the inductors L1 and L2 of the high-pass filter circuits HPF1 and HPF2 are constituted by helical coiled conductors 64 and 65 which are disposed on the surface of the insulating sheet 58. This means that the height of the inductors L1 and L2 are substantially the same as the length of the inductor via hole 68, i.e., the sum of the lengths of the inductor via holes 68a and 68b, or the length of the inductor via hole 69, i.e., the sum of the lengths of the inductor via holes 69a and 69b. It is therefore possible to reduce the height of the inductors L1 and L2.

The helical coiled conductors 64 and 65 are disposed on the surface of the insulating sheet 58. This means that the inductors L1 and L2 can have a large inductance value. Although the high-pass filter circuits HPF1 and HPF2 require inductors L1 and L2 having large inductance value, an inductor having a comparatively small inductance value suffices for the inductor L3 of the trap circuit T. For instance, a laminated LC high-pass filter device 51 for use in a 2.4 GHz band can be implemented by using the inductors L1, L2 having inductance value of about 1.5 nH, capacitors C1, C2 having capacitance value of about 2.54 pF, inductor L3 having inductance value of about 1.0 nH and the capacitor C5 having capacitance value of about 9.56 pF.

Therefore, by arranging the high-pass filter inductors L1, L2 and the trap inductor L3 on different layers, it is possible to reduce the length of the trap inductor L3. The central frequency of the trap circuit T is in inverse proportion to (LC). Therefore, in order to maintain a given central frequency while using an inductor L3 having a smaller inductance, it is necessary to increase the capacitance of the capacitor C5. The capacitance of the capacitor C5 can be increased without substantial difficulty, by reducing the thickness of the insulating sheet 52. Therefore, the laminated LC high-pass filter device can still have a reduced height even though the high-pass filter inductors L1, L2 and the trap inductor L3 are disposed at different levels in the direction of the stack constituting the laminated structure 71.

Figure 13:
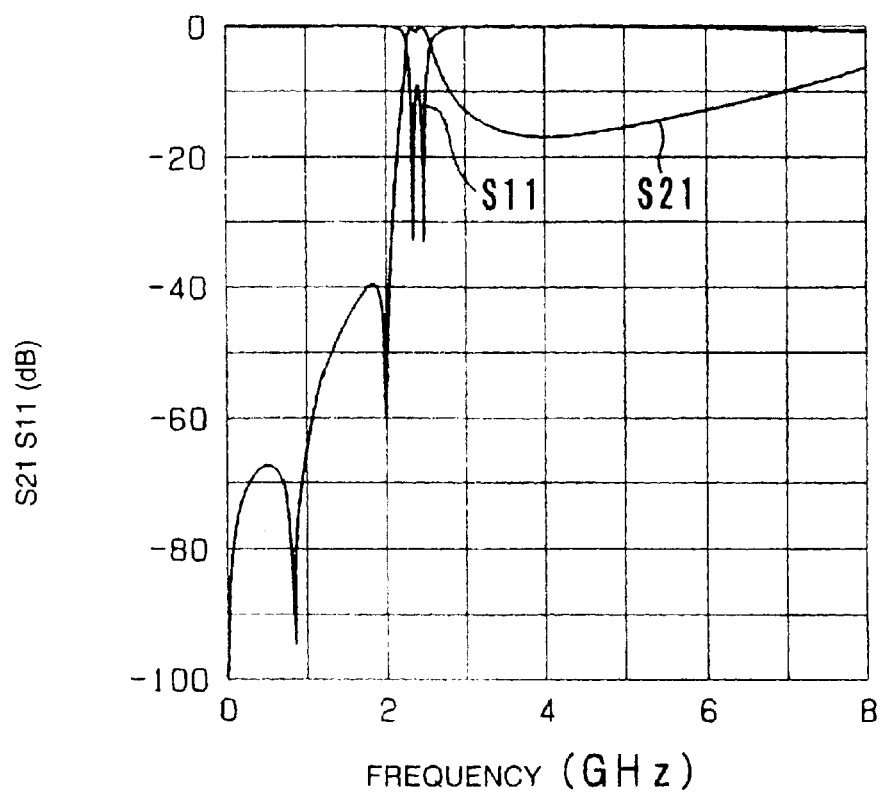
FIG. 13 is a graph showing the transmission characteristic S21 and the reflection characteristic S11 of the laminated LC high-pass filter device shown in FIG. 11.

The laminated LC high-pass filter device 51 has excellent RF characteristics because portions of the inductors L1, L2 and the entirety of the inductor L3 are formed of columnar inductors 67, 68 and the columnar inductor 69 which have high Q values. In addition, since the entirety of the inductor L3 of the trap circuit T is formed of the columnar inductor 67, an attenuation pole exhibiting high attenuation can be formed in the vicinity of the pass band of the high-pass filter circuit PHF1 and PHF2, thus implementing sharp filter characteristics. FIG. 13 shows the transmission characteristic S21 and the reflection characteristic of the laminated LC high-pass filter device 51.

Figure 14:
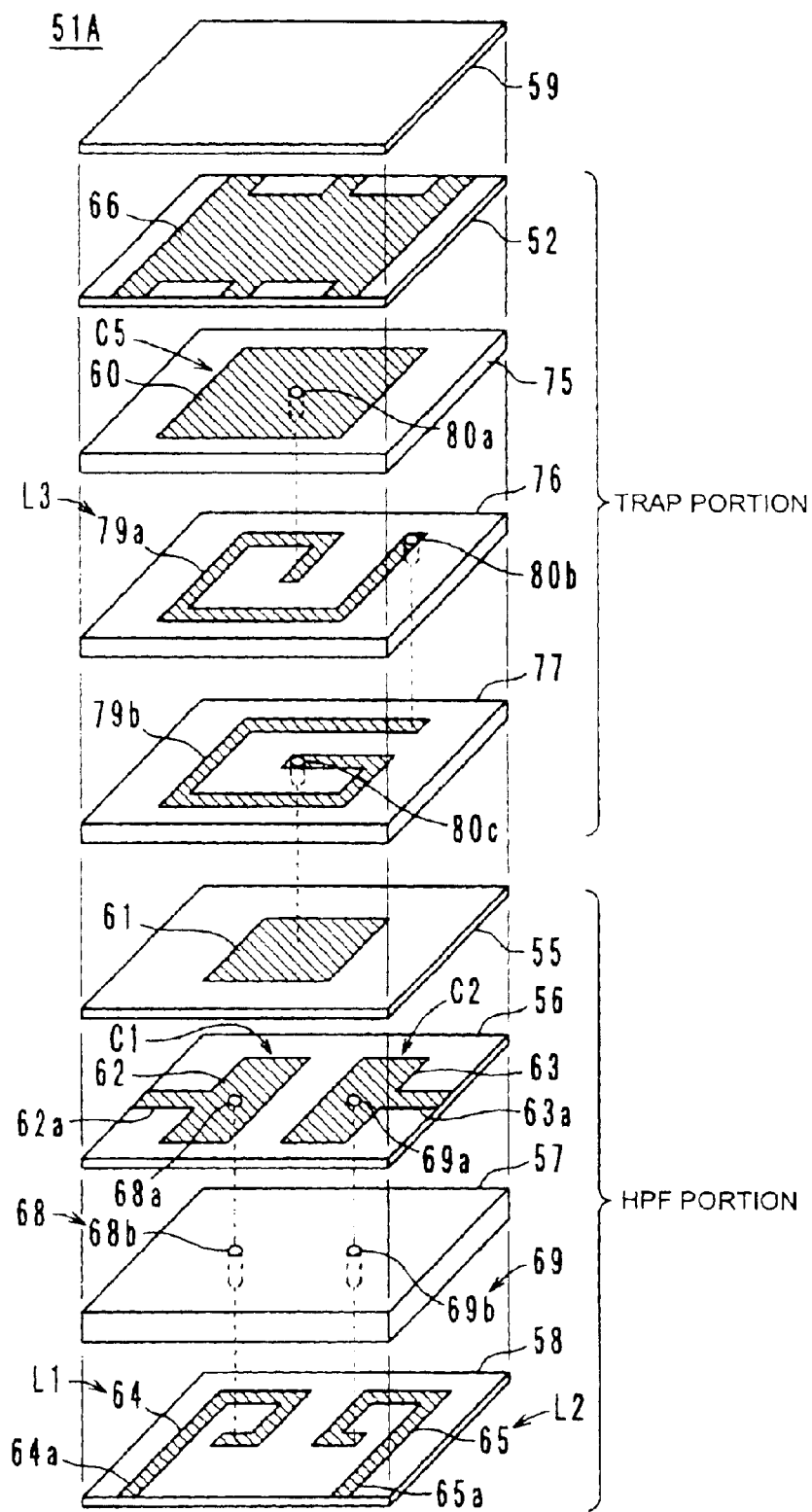
FIG. 14 is an exploded perspective view of a fourth preferred embodiment of the laminated LC high-pass filter device in accordance with the present invention.

FIG. 14 shows a laminated LC high-pass filter device 51A according to a fourth preferred embodiment of the present invention. In this preferred embodiment, at least a portion of each of the inductors L1 to L3 has spiral shape. More specifically, as shown in FIG. 14, the inductor L3 of the trap circuit T may be constituted by inductor via holes or columnar inductors 80a, 80b and 80c which are formed in insulating sheets 75, 76 and 77 and spiral coiled conductors 79a and 79b. The laminated LC high-pass filter device 51A exhibits sharp filter characteristics by virtue of the high Q values of the spiral coiled conductors 79a, 79b and columnar inductors 80a to 80c.

The present invention encompasses a device including a laminated structure incorporating a plurality of filter devices which may be of the type described above, such as the laminated LC high-pass filter device 1, 1A, 51 or 51A, implementing a multiplexer such as a duplexer or a triplexer. The present invention also relates to a radio communication apparatus including such a multiplexer.

Figure 15:
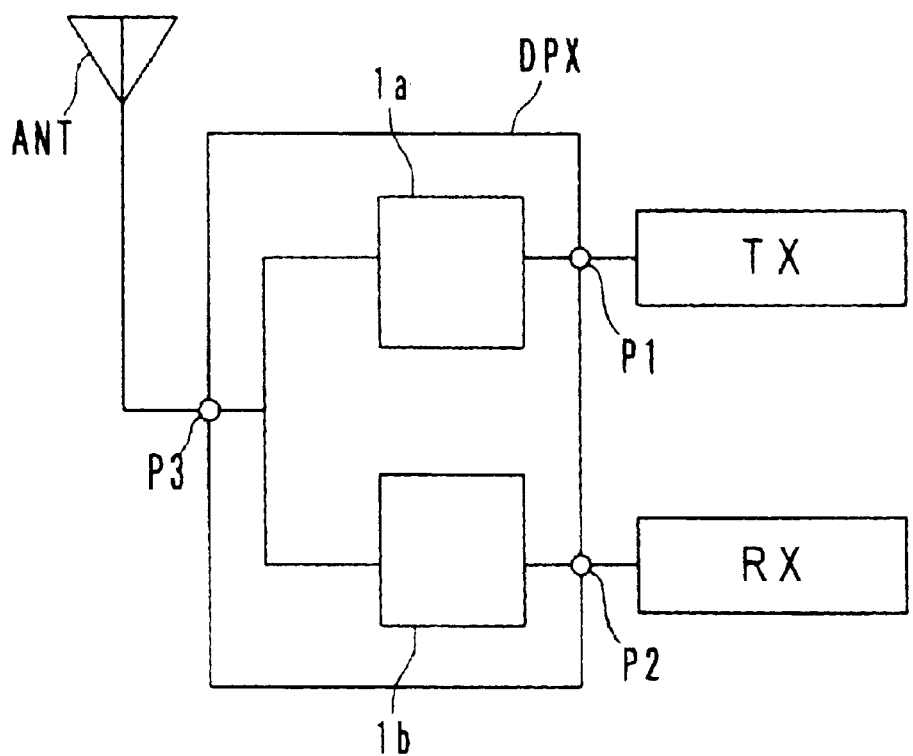
FIG. 15 is a block diagram of an RF section of a preferred embodiment of a radio communication apparatus in accordance with the present invention.
Figure 16:
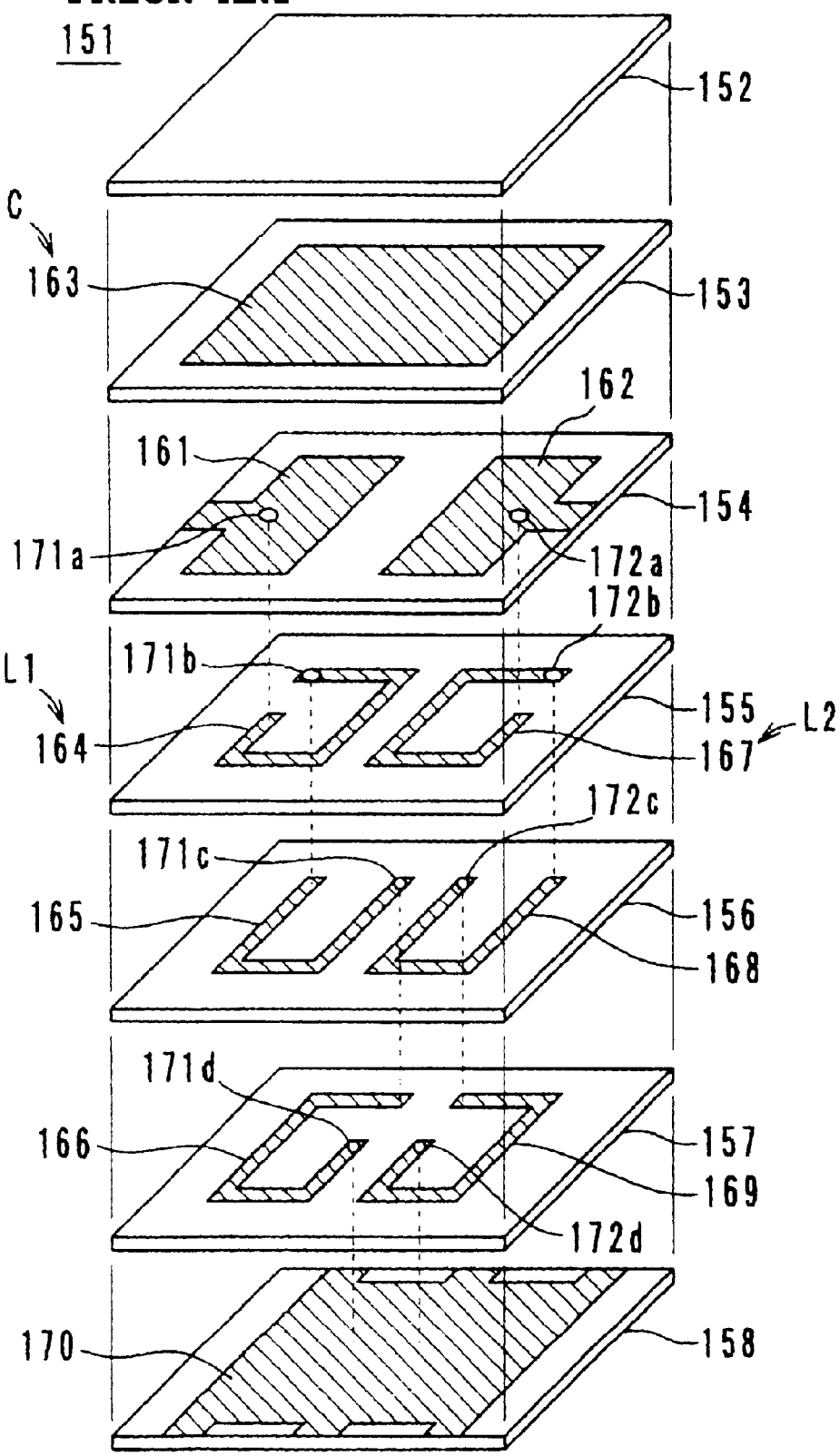
FIG. 16 is an exploded perspective view of a known laminated LC high-pass filter device.
Figure 17:
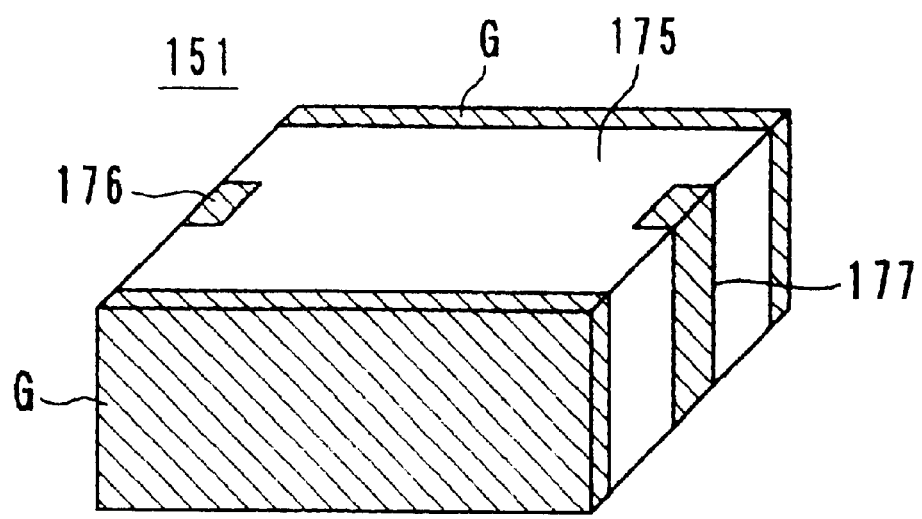
FIG. 17 is a perspective view of the laminated LC high-pass filter device shown in FIG. 16.

By way of example, FIG. 15 shows a radio communication apparatus generally denoted by 81 and having a duplexer DPX including a pair of units of laminated LC high-pass filter device which may be the laminated LC high-pass filter device 1 of the first preferred embodiment. More specifically, the duplexer DPX includes a pair of units 1a, 1b of laminated LC high-pass filter device electrically connected to each other, and has three ports P1, P2 and P3. The port P1 of the duplexer DPX is disposed on one end of the laminated LC high-pass filter device 1a and is connected to a transmitting section TX. The port P2 of the duplexer is disposed on one end of the laminated LC high-pass filter device 1b and is connected to a receiving section RX. The port P3 of the duplexer DPX is connected to other ends of the laminated LC high-pass filter device units 1a, 1b and is connected to an antenna ANT.

It is thus possible to provide a duplexer having a reduced height by using the incorporating a pair of units of the laminated LC high-pass filter device 1. A multiplexer such as a triplexer that is capable of dealing with three different frequencies can be obtained by using a plurality of units of the laminated LC high-pass filter device 1. Although in the described embodiment the duplexer DPX includes a pair of units of the laminated LC high-pass filter device 1, this is not exclusive and a duplexer can be implemented also by combining one unit of the laminated LC high-pass filter device 1 and a different type of filter such as a surface acoustic wave filter.

Although specific preferred embodiments have been illustrated and described in regard to the high-pass filter circuit device, laminated LC high-pass filter device, multiplexer and radio communication apparatus, it is to be understood that these preferred embodiments are not exclusive and various changes and modifications may be imparted thereto without departing from the spirit and scope of the present invention.

Thus, RF composite devices such as an RF diode switch, transceiver device, RF module and so forth fall within the scope of the present invention as long as such devices includes as a component thereof a high-pass filter circuit device or a laminated LC high-pass filter device which embodies the present invention.

Although in the foregoing the laminated LC high-pass filter device has been described as preferably being produced by separately preparing insulating sheets having conductors and/or via holes, and stacking and baking these sheets together, such a production process is only illustrative. For instance, the laminated LC high-pass filter device of various preferred embodiments of the present invention may be manufactured by stacking insulating sheets that have been baked. It is also possible to produce the laminated LC high-pass filter device of various preferred embodiments of the present invention by a printing/application process having the steps of forming an insulating layer by, for example, a printing technique from a paste-type insulating material, forming a conductor on the surface of the insulating layer by applying a paste-type conductive material and/or forming a via hole through the insulating layer, applying the paste-type insulating material to form an overlying insulating layer, and repeating such steps.

As will be understood from the foregoing description, in accordance with various preferred embodiments of the present invention, a pair of high-pass filter circuits and a single trap circuit are suitably combined, so that the attenuation pole of the trap circuit can be located near the pass band of the high-pass filter circuits, whereby an LC high-pass filter circuit device having sharp characteristics can be obtained. By using such high-pass filter circuit device, it is possible to obtain an LC high-pass filter device, a multiplexer and a radio communication apparatus that have reduced areas and heights. In accordance with the present invention, inductors are preferably formed of inductor via holes that have axes extending in the stacking direction of the stack of insulating layers. This permits high Q values of the high-pass filter circuits and trap circuit. Since such via holes occupy only small planar areas, it is possible to reduce the area of the laminated LC high-pass filter device.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:
1. An LC high-pass filter circuit device, comprising:
   a pair of terminals including an input terminal and an output terminal;
   at least two high-pass filter circuits including first capacitors connected in series between the input and output terminals and first inductors connected to the input and output terminals in parallel with each other and grounded, each of said high-pass filter circuits having one of said first capacitors and one of said first inductors;
   a trap circuit including a series connection of a second capacitor and a second inductor, said series connection being grounded at one end thereof and connected between two adjacent high-pass filter circuits so as to shunt from the input and output terminals; and
   third capacitors connected between the input and output terminals and to the node between said second capacitor and said second inductor of said trap circuit, said third capacitors defining band-adjusting capacitors.

2. The LC high-pass filter circuit device according to claim 1, wherein said first capacitor of each said at least two high-pass filter circuits is connected between the corresponding first inductor and said trap circuit.

3. A multiplexer comprising an LC high-pass filter circuit device of claim 1.

4. A radio communication apparatus comprising the multiplexer of claim 3.

5. A radio communication apparatus comprising the LC high-pass filter circuit device of claim 1.

6. A laminated IC high-pass filter device, comprising:
   a laminated structure including a stack of a plurality of insulating layers, a plurality of capacitive conductors, and a plurality of called conductors;
   an input terminal, an output terminal, and a grounding terminal provided on surfaces of said laminated structure;
   a plurality of high-pass filter circuits disposed in said laminated structure, each of said high-pass filter circuits having a first capacitor defined by one of said capacitive conductors and a first inductor defined by one of said coiled conductors; and
   a trap disposed in said laminated structure and having a series connection of a second capacitor and a second inductor, said second capacitor being defined by one of said capacitive conductors and said second inductor being defined by one of said coiled conductors;
   wherein said first capacitors of said high-pass filter circuits are connected in series between said input terminal and said output terminal, and said first inductors of said high-pass filter circuits are connected to said Input terminal and said output terminal in parallel to each other and are connected also to said grounding terminal; and
   wherein said trap is connected between two adjacent high-pass filter circuits so as to shunt from said input terminal and said output terminal, said series connection of said second capacitor and said second inductor being connected to said grounding terminal.

7. The laminated LC high-pass filter device according to claim 6, wherein the coiled conductor constituting said first inductor and the coiled conductor constituting said second inductor are located at different positions in the stacking direction of the stack of said plurality of insulating layers, said plurality of capacitive conductors, and said plurality of coiled conductors defining said laminated structure.

8. The laminated LC high-pass filter device according to claim 6, wherein at least a portion of the coiled conductor constituting said first inductor and at least a portion of the coiled conductor constituting said second inductor are defined by inductor via holes formed in said insulating layers.

9. The laminated LC high-pass filter device according to claim 6, wherein at least a portion of the coiled conductor constituting said first inductor and at least a portion of the coiled conductor constituting said second inductor are defined by helical coiled conductors provided on said insulating layers.

10. The laminated LC high-pass filter device according to claim 6, wherein at least a portion of the coiled conductor constituting said first inductor and at least a portion of the coiled conductor constituting said second inductor are defined by spiral coiled conductors provided on said insulating layers.

11. The laminated LC high-pass filter device according to claim 6, wherein said trap is disposed at a level higher than that of said high-pass filter circuits in the stacking direction of the stack of said plurality of insulating layers, said plurality of capacitive conductors, and said plurality of coiled conductors defining said laminated structure.

12. The laminated LC high-pass filter device according to claim 11, wherein said first inductor of each of said high-pass filter circuits has a major portion constituted by an inductor via hole having an axis extending in the in the stacking direction of the stack of said plurality of insulating layers, said plurality of capacitive conductors, and said plurality of coiled conductors defining said laminated structure and a minor portion defined by one of a helical coiled conductor and a spiral coiled conductor provided on the surface of one of said insulating layers, said major portion and said minor portions being electrically connected to each other.

13. A multiplexer comprising a laminated LC high-pass filter device of claim 6.

14. A radio communication apparatus comprising the laminated LC high-pass filter device of claim 6.

* * * * *